United States Patent [19]
Hiroki

[11] Patent Number: 5,757,840
[45] Date of Patent: May 26, 1998

[54] SEMICONDUCTOR LASER MODULATION METHOD THEREFOR AND OPTICAL COMMUNICATION SYSTEM USING THE SAME

[75] Inventor: Tamayo Hiroki, Zama, Japan

[73] Assignee: Canon Kabushiki Kaisha, Tokyo, Japan

[21] Appl. No.: 923,972

[22] Filed: Sep. 5, 1997

Related U.S. Application Data

[63] Continuation of Ser. No. 581,381, Dec. 8, 1995, abandoned.

[30] Foreign Application Priority Data

Dec. 17, 1994 [JP] Japan .................. 6-334066

[51] Int. Cl.$^6$ .................. H01S 3/19; H01S 3/10
[52] U.S. Cl. .................. 372/96; 372/27; 372/50
[58] Field of Search .................. 372/96, 27, 50

[56] References Cited

U.S. PATENT DOCUMENTS

| | | | |
|---|---|---|---|
| 4,740,987 | 4/1988 | McCall, Jr. et al. | 372/96 |
| 4,796,273 | 1/1989 | Yamaguchi | 372/96 |
| 5,117,469 | 5/1992 | Cheung et al. | 385/11 |
| 5,208,822 | 5/1993 | Haus et al. | 372/50 |
| 5,659,560 | 8/1997 | Ouchi et al. | 372/27 |
| 5,699,373 | 12/1997 | Uchida et al. | 372/27 |

FOREIGN PATENT DOCUMENTS

| | | |
|---|---|---|
| A0332453 | 9/1989 | European Pat. Off. . |
| 62-042593 | 2/1987 | Japan . |

OTHER PUBLICATIONS

"Optical Communication Device", Patent Abstract of Japan, JP2159781, vol. 14, No. 414, Sep. 7, 1990.

Hidenao Tanaka, et al., "Highly efficient TE/TM Mode Switching of GaASP/AlGaAS Strained Quantum–well Laser Diodes", Applied Physics Letters, 64 (1994) 10 Jan., No. 2, pp. 158–160.

H. Kobrinski, et al., "Simultaneous Fast Wavelength Switching and Intensity Modulation Using a Tunable DBR Laser", IEEE Photonics Technology Letters, vol. 2, No. 2, Feb. 1, 1990, pp. 139–142.

Takahiro Numai, "1.5-μm Wavelength Tunable Phase-Shift Controlled Distributed Feedback Laser", Journal Of Lightwave Technology, 10 (1992) Feb., No. 2, pp. 199–205.

*Primary Examiner*—James W. Davie
*Attorney, Agent, or Firm*—Fitzpatrick, Cella, Harper & Scinto

[57] ABSTRACT

A semiconductor laser includes a distributed feedback semiconductor laser structure having a plurality of regions. The regions are electrically separated from each other. A phase shift section is provided in a grating in one of the regions. In the semiconductor laser, $\alpha$ parameters for transverse electric (TE) and transverse magnetic (TM) polarization modes, in the vicinity of threshold currents for the TE mode and the TM mode, are made different from each other. An $\alpha$ parameter is defined by $4\pi/\lambda \cdot (dn/dN)/(dg/dN)$ where $\lambda$ is a Bragg wavelength, $n$ is an effective refractive index, $N$ is an injection carrier density and $g$ is a gain for each of the TE mode and the TM mode.

20 Claims, 13 Drawing Sheets

Ls = 0.5L

Ls = 0.65L

LIGHT SIGNAL 7'
FOR LASER

SIGNAL 6' AFTER TRANSMISSION
THROUGH FILTER

CHARACTERISTIC OF
RECEIVING FILTER

SEMICONDUCTOR LASER MODULATION METHOD THEREFOR AND OPTICAL COMMUNICATION SYSTEM USING THE SAME

This application is a continuation of application Ser. No. 08/581,381 filed Dec. 8, 1995, now abandoned.

BACKGROUND OF THE INVENTION

1. Field of the Invention

The present invention relates to a semiconductor laser for use in the fields of optical communication systems, such as optical local area (LAN) networks, optical information processing, optical recording and the like, a modulation method for modulating or driving the semiconductor laser and an optical communication system using the semiconductor laser as a transmitter, for example.

2. Related Background Art

A prior art device is illustrated in FIG. 1 (see Japanese Patent Laid-Open No. 62(Showa)-42593). In the prior art device, an n-type InGaAsP guide layer 519, an InGaAsP active layer 520, a p-type InP clad layer 521 and a p-type InGaAsP contact layer 522 are formed on an n-type InP substrate 511. A stripe-shaped mesa structure is formed, and the mesa structure is buried in a layer structure including layers of a p-type InP 512, an n-type InP 513 and an n-type InGaAsP 514. Along the guide layer 519, there is formed a corrugation whose depth D is from 50 nm to 150 nm and whose pitch is 400 nm. The length LL of a cavity or resonator in a longitudinal direction amounts to 400 µm. Further, coatings 518 of $Al_2O_3$ are provided on end facets of the device to eliminate light reflection thereat. Reference numeral 515 designates an insulating layer of $SiO_2$, and reference numerals 516 and 517 respectively designate p-type and n-type electrodes.

In such distributed feedback (DFB) laser, magnitudes of gain for transverse electric (TE) and transverse magnetic (TM) polarization modes are made approximately equal to each other, and hence, the device can oscillate in either the TE mode or the TM mode. When a current injected into the device is changed or modulated, the oscillation polarization mode is switched between the TE mode and the TM mode. In the laser described above, when a bias current is set to a magnitude a little less than what enables the switching from the TE mode to the TM mode and a minute modulation current is superposed on the bias current, oscillation switching between the TE mode and the TM mode occurs. The thus-modulated light from the device is passed through a polarizer which is adjusted to select only light in either the TE mode or the TM mode. Thus, modulation at high speed and with a high extinction ratio can be attained.

A DFB laser as shown in FIG. 1, however, varies in characteristics depending on differences between effective refractive indices, internal gains, Bragg wavelengths and the like for the TE mode and the TM mode, and the operation thereof becomes unstable and complicated. Thus, yield of the TE/TM tunable device is poor. Furthermore, there are problems as follows. The bias point of the device is difficult to detect during modulation. In addition, the mode hop is intricate, and hence, the wavelength control is difficult when the device is used as a wavelength tunable light source.

SUMMARY OF THE INVENTION

It is an object of the present invention to provide a semiconductor laser for use in the fields of optical communication systems such as optical local area (LAN) networks, optical information processing, optical recording and the like, a modulation method for driving the semiconductor laser and an optical communication method and system using the semiconductor laser.

The object of the present invention is achieved by the following semiconductor laser, optical communication method and system.

One aspect of the present invention provides a semiconductor laser which includes a distributed feedback semiconductor laser structure having a plurality of regions which are electrically separated from each other, and a phase shift section provided in a grating in one of the regions. In the semiconductor laser, α parameters (see below) for transverse electric (TE) and transverse magnetic (TM) polarization modes, in the vicinity of threshold currents for the TE mode and the TM mode, are adapted to be different from each other. An α parameter is defined by $4\pi/\lambda \cdot (dn/dN)/(dg/dN)$, where $\lambda$ is a Bragg wavelength, n is an effective refractive index, N is an injection carrier density and g is a gain, $\lambda$, n, N and g being defined for each of the TE mode and the TM mode, and dn/dN and dg/dN are respectively the first derivatives of n and g with respect to N. Hence, TE-mode and TM-mode oscillation zones can be assuredly procured, and yield and controllability of the semiconductor laser can be improved.

The following structures may be adopted. The phase shift imparted by the phase shift section is $\lambda/4$. At least one of the regions may include a phase control region without an active layer for controlling only the phase of a propagating wave. At least two regions of the distributed feedback semiconductor laser structure may include a bulk active layer. At least two regions of the distributed feedback semiconductor laser structure may include an active layer which has a strained quantum well (QW) structure into which a biaxial tensile strain is introduced. At least two of the regions may include an active region which includes an active layer, and the phase shift section may be provided at the location of one of the active region which is offset from the center of the two active regions. The distance Ls of the phase shift section from an end facet of the semiconductor laser may be within $0.2 \leq Ls/L \leq 0.45$ or $0.55 \leq Ls/L \leq 0.8$ where L is the total length of the active regions, each of which includes an active layer.

Another aspect of the present invention provides an optical communication method or system for transmitting a signal from a transmitter to a receiver through an optical transmission line, wherein the polarization mode of output light from the above semiconductor laser is modulating between transverse electric (TE) and transverse magnetic (TM) polarization modes by controlling a current injected into the semiconductor laser, only the output light in either the TE mode or the TM mode is selected by selecting means to create an amplitude-modulated signal, and the amplitude-modulated signal is transmitted through an optical transmission line.

The wavelength of the amplitude-modulated signal may be tunable by the semiconductor laser, and a signal at a desired wavelength may be selectively detected by using a wavelength filter at a receiver side. A plurality of semiconductor lasers may be used and a plurality of wavelength filters may be used to selectively detect signals at respective desired wavelengths to perform wavelength division multiplexing optical communication.

These features, advantages and others will be more fully understood from the following detailed description of the preferred embodiments taken in conjunction with the drawings.

DESCRIPTION OF THE PREFERRED EMBODIMENTS

First Embodiment

Figure 1:
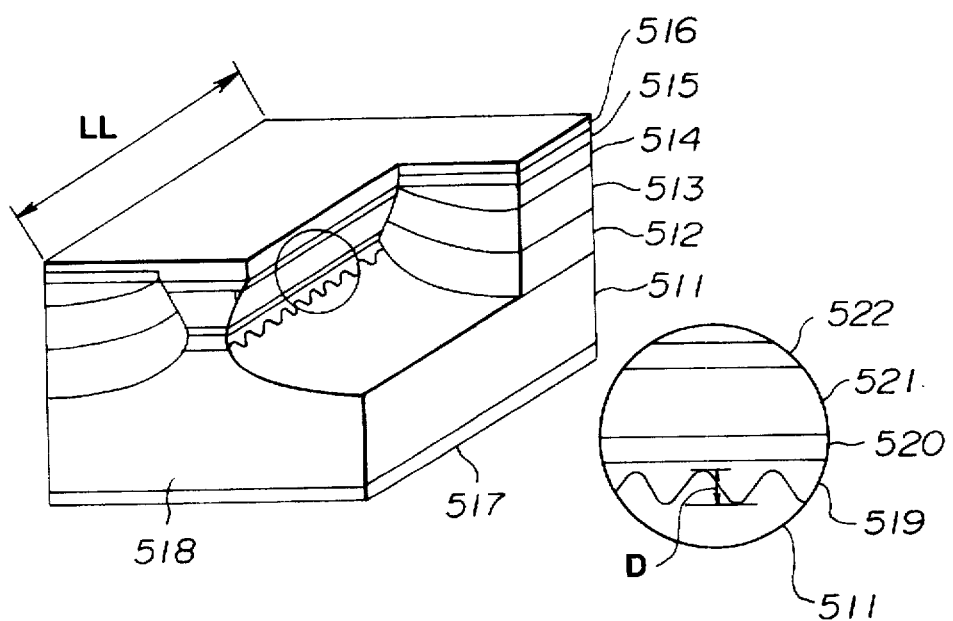
FIG. 1 is a view illustrating a prior-art DFB semiconductor laser.
Figure 2:
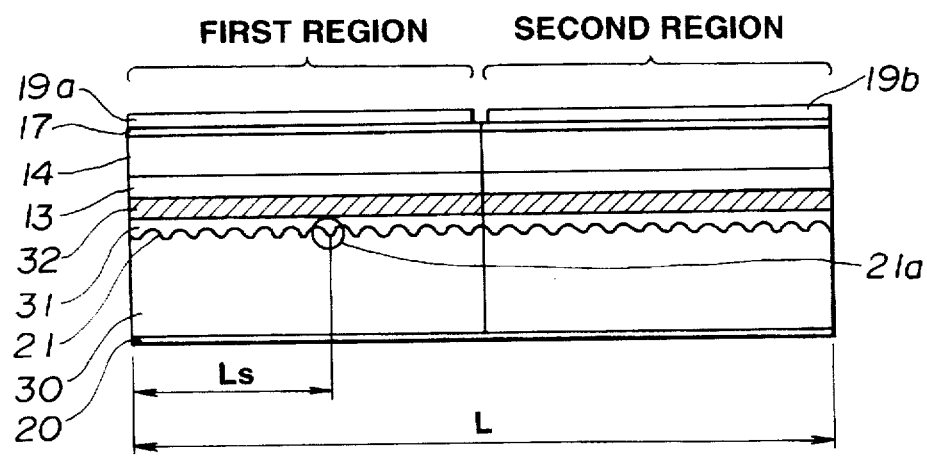
FIG. 2 is a cross-sectional view of a first embodiment of a semiconductor laser according to the present invention.

A first embodiment of the present invention will be described with reference to FIG. 2.

A fabrication method of a device will be described. A diffraction grating 21 is formed on an n-type InP substrate 30. The diffraction grating 21 has a λ/4 phase shift section 21a at a position which is a distance Ls away from the end facet of the device. The distance Ls appropriately falls within the range 0.2≦Ls/L≦0.45 or 0.55≦Ls/L≦0.8. In this embodiment, Ls/L is set to 0.4. On the grating 21, an n-type InGaAsP guide layer 31, an undoped(φ)-InGaAsP active layer 32, a p-type InGaAsP buffer layer 13, a p-type InP clad layer 14 and a p-type InGaAsP contact layer 17 are consecutively laid down in this order. Then, etching is conducted down to the substrate 30 with a mesa stripe of a width 2 μm being left, and then the substrate 30 is buried with an n-type InP layer and a p-type InP layer (not shown). Respective first and second regions are electrically separated from each other so that currents injected into those regions can be independently controlled. The first region has the λ/4 phase shift section 21a. Further, p-type electrodes 19a and 19b are formed on the contact layer 17, and an n-type common electrode 20 is formed on the bottom surface of the device. The cavity length is made 600 μm. Antireflection (AR) coatings (not shown) are deposited on the end facets of the device to establish a reflectance less than 0.1% thereat.

Figure 3A:
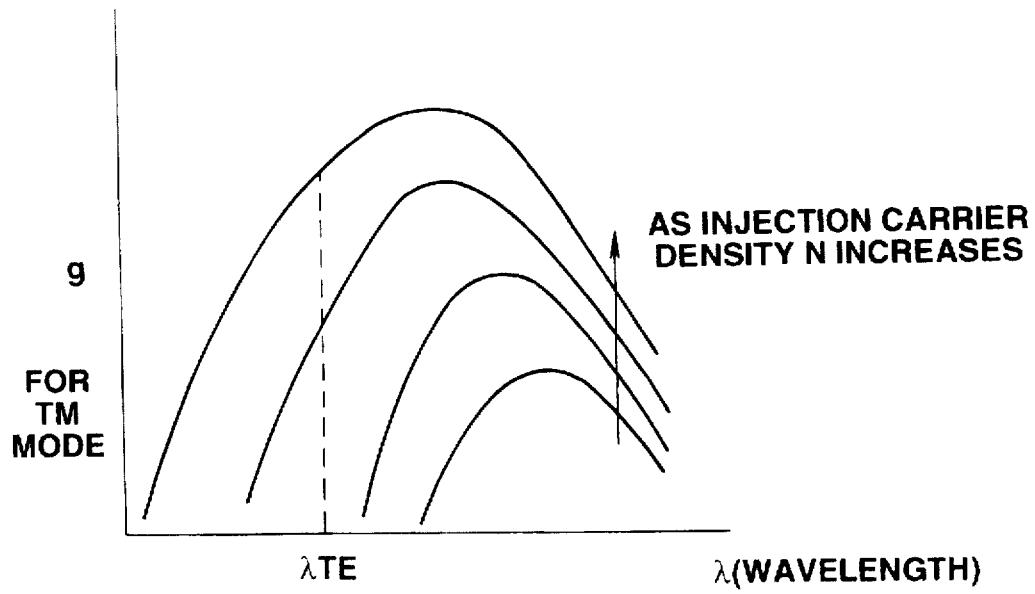
FIGS. 3A and 3B are graphs illustrating gain spectra for the TE mode and the TM mode, respectively.
Figure 3B:
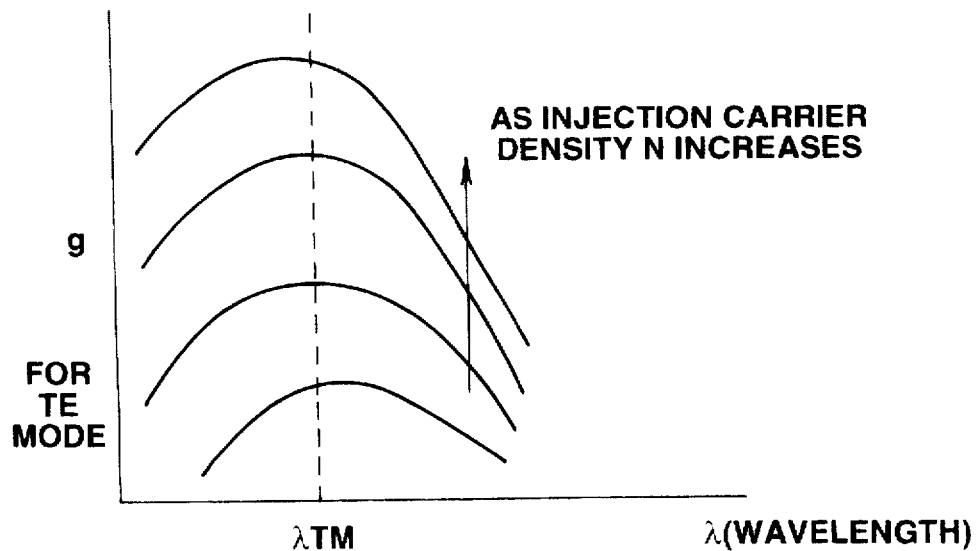

The device operates in the following manner. In the DFB-LD of this embodiment, effective refractive indices n for the TE polarization mode and the TM polarization mode differ from each other, so Bragg wavelengths $\lambda_{TE}$ and $\lambda_{TM}$ for those polarization modes are also different from each other. The wavelength difference therebetween is approximately 4 nm. The relation between injection carrier density N and gain g for each polarization mode is illustrated in FIGS. 3A and 3B. As the wavelength varies, the value of dg/dN changes and hence so does the a parameter defined as $4\pi/\lambda \cdot (dn/dN)/(dg/dN)$. In this embodiment, the effective refractive indices n for the TE polarization mode and the TM polarization modes differ from each other as described above, so the α parameters for those polarization modes in the vicinity of threshold current density also differ.

Figure 4:
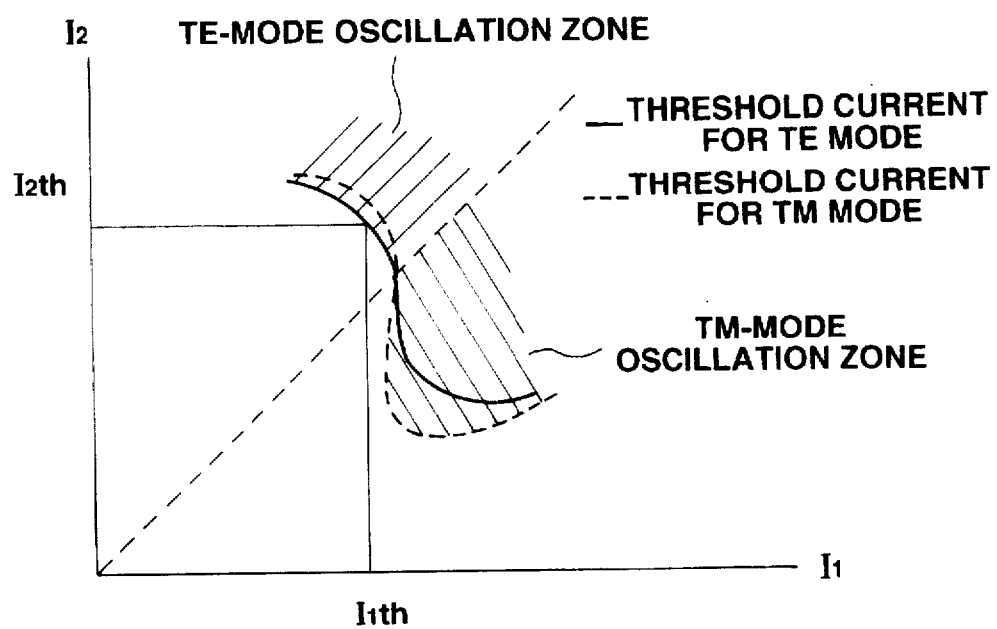
FIG. 4 is a graph illustrating the relationship between threshold currents injected through two electrodes of the first embodiment.

FIG. 4 illustrates the relationship between threshold currents injected through the two electrodes 19a and 19b of the DFB-LD of this embodiment. When the relationship between threshold currents injected through the two electrodes for the TE plarizaton mode is examined, it can be seen from a solid curve in FIG. 4 that the relation is asymmetrical with respect to a line of $I_1=I_2$, where $I_1$ is current injected into the first region and $I_2$ is current injected into the second region, because the λ/4 phase shift section 21a is formed only in one of the two regions (i.e., the first region). Owing to the λ/4 phase shift section 21a, a sum of threshold currents $(I_{1th}+I_{2th})$ in a zone of $I_1>I_2$ is less than that in the other zone $(I_1<I_2)$. The relation between the threshold curents varies depending on the location of the λ/4 phase shift section 21a.

Turning to the case of the TM polarization mode, since the value of dg/dN is different from that for the TE mode, as mentioned above, the relationship between threshold currents injected through the two electrodes for the TM mode differs from that in the TE mode. Also, the relation for the TM mode is asymmetrical with respect to the line of $I_1=I_2$ owing to the asymmetrical location of the λ/4 phase shift section 21a (see the dashed curve in FIG. 4). As a result, lowering one of the threshold currents for the TE mode and the TM mode is likely to cause oscillation. The two curves for TE-mode and TM-mode threshold currents intersect each other, resulting in oscillation zones for the TE mode and the TM mode as shown in FIG. 4. Therefore, it is possible to switch the oscillation mode between the TE mode and the TM mode by adjusting the injection current. Making the oscillation zones for the TE mode and the TM mode asymmetrical with respect to the line $I_1=I_2$ establishes oscillation zones with high yields.

Figure 5A:
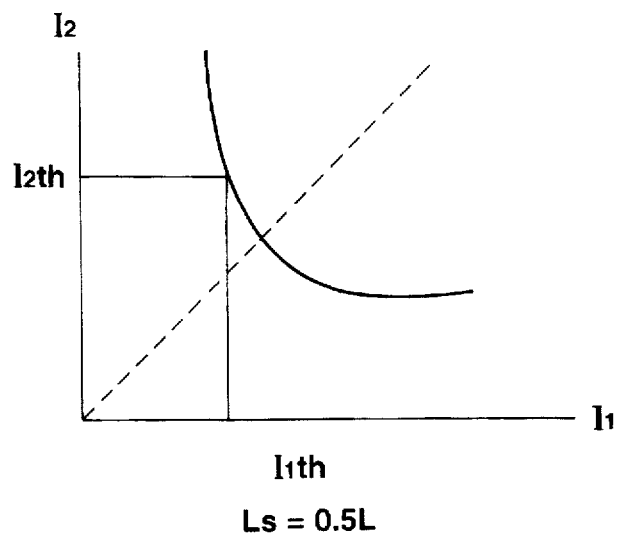
FIGS. 5A and 5B are graphs illustrating the relationship between threshold currents injected through two electrodes of the first embodiment observed when a phase shift section is formed at different locations Ls.
Figure 5B:
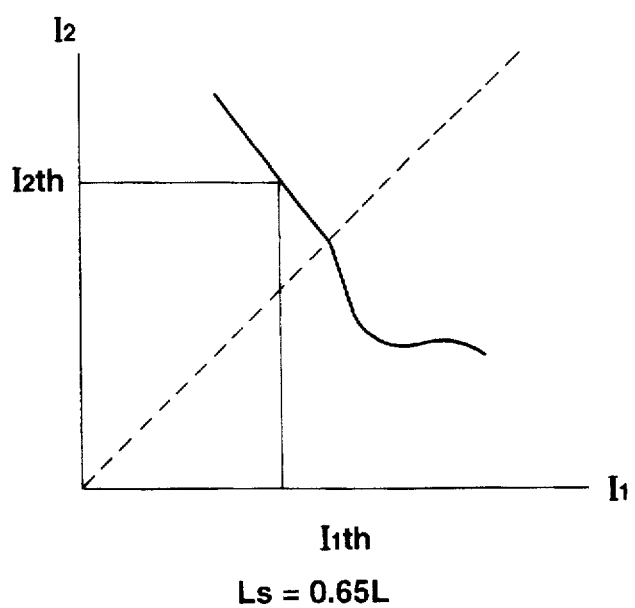

FIGS. 5A and 5B illustrate relationships between the threshold currents for each polarization mode in cases of different locations of the λ/4 phase shift section 21a. FIG. 5A illustrates the case of Ls=0.5 L, while FIG. 5B illustrates the case of Ls=0.65 L, where Ls is the distance between the end facet and the phase shift section 21a and L is the cavity length. In FIG. 5A, the sum of the threshold currents $(I_{1th}+I_{2th})$ is lowest when $I_1=I_2$. In contrast, in FIG. 5B, the sum of the threshold currents is almost constant in the zone where $I_1<I_2$ and decreases where $I_1>I_2$. More specifically, in the zone where the current injected into the first region with the λ/4 phase shift section 21a is dominant, the influence of the λ/4 phase shift section 21a increases in the case of FIG. 5B. The sum of the threshold currents $(I_{1th}+I_{2th})$ is, however, greater than that is the case of FIG. 5A. It is preferable to satisfy the relation 0.2≦(Ls/L)≦0.45 or 0.55≦(Ls/L)≦0.8 to increase the asymmetry. Thus, when the λ/4 phase shift section 21a is provided at such a distance Ls and the α parameters for those polarization modes are set as described above, the separately confined TE and TM oscillation zones can be stably established with a high yield. The injection currents $I_1$ and $I_2$ are controlled to switch the oscillation mode.

Figure 6:
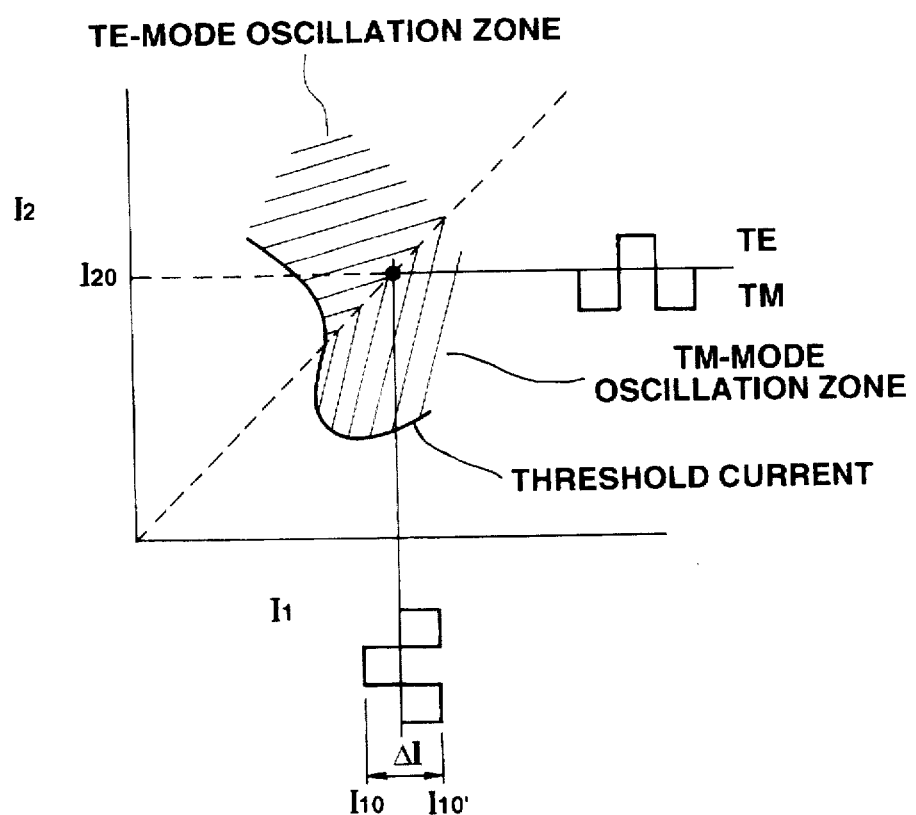
FIG. 6 is a graph illustrating a modulation method for driving the first embodiment.

FIG. 6 illustrates a modulation method for driving the laser of this embodiment. A bias current $I_{20}$ is injected into the second region of the semiconductor laser, and a bias current $I_{10}$ is injected into the first region on which a modulation current $\Delta I=I_{10}'-I_{10}$ is superposed. Thereby, output light from the device is modulated to switch between the TE polarization mode and the TM polarization mode. The output light is input into a polarizer and only light in either the TE mode or the TM mode is transmitted therethrough. Thus, light power can be generated as a zero-one signal.

Figure 7A:
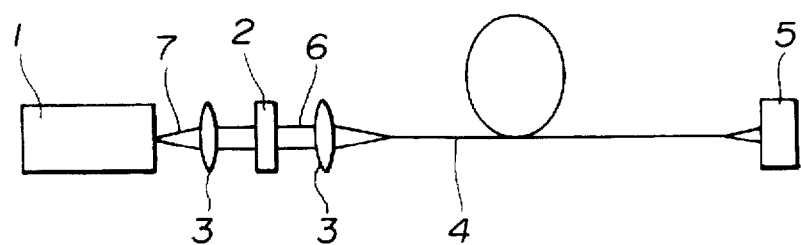
FIGS. 7A, 7B and 7C are views illustrating an optical communication system in which the first embodiment and its modulation method are used.
Figure 7B:
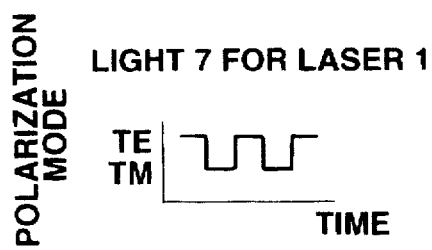
Figure 7C:
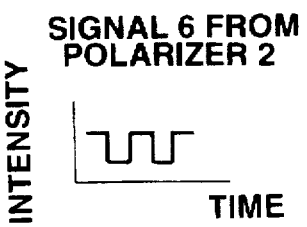

FIG. 7A shows the structure of an optical communication system which uses a semiconductor laser of this embodiment and its modulation method. According to the method of FIG. 6, the modulation current is injected into a semiconductor laser 1 which has the characteristics illustrated in FIG. 6, and output light 7 is switched between the TE polarization mode and the TM polarization mode. The light 7 is input into a polarizer 2 through a lens 3, and only light in the TE mode or light in the TM mode is transmitted therethrough. Thus, a signal 6 having power 1 or 0 can be produced. The light 6 transmitted through the polarizer 2 is coupled to an optical fiber 4 using the lens 3. The light 6 is transmitted through the optical fiber 4 and the signal of the light 6 is detected by a photodetector 5.

In this embodiment, signal modulation with large extinction ratio can be obtained with a minute modulation current. Therefore, fluctuation in carrier density in the laser is small, so chirping is reduced and the line width of oscillation spectrum is decreased. Hence, high-speed modulation can be achieved with favorable characteristics.

Second Embodiment

Figure 8:
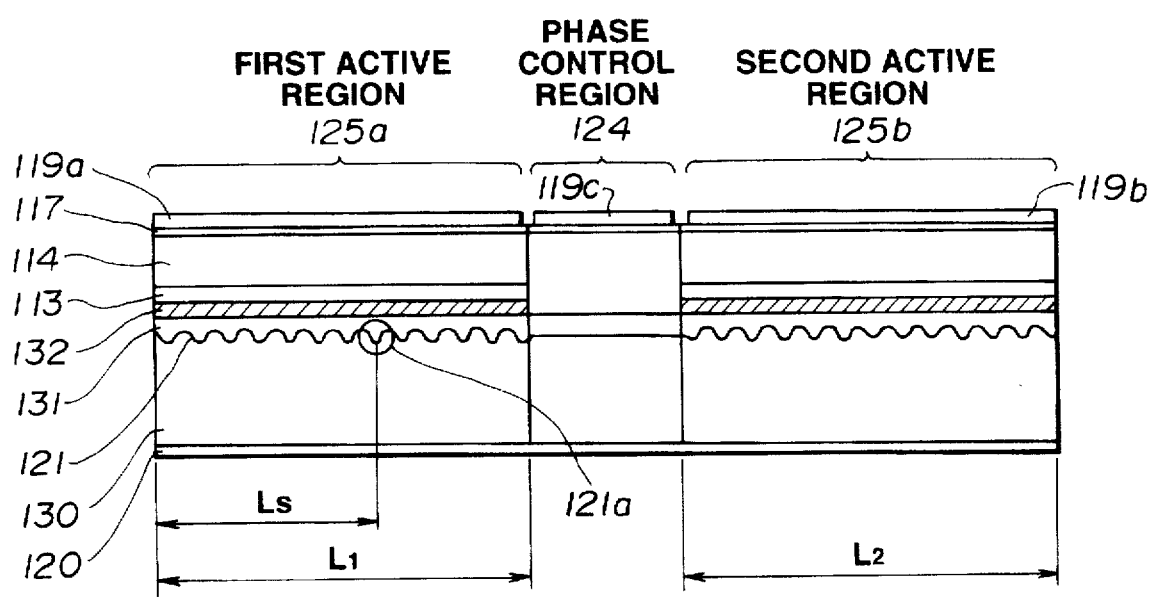
FIG. 8 is a cross-sectional view of a second embodiment of a semiconductor laser according to the present invention.

A second embodiment of the present invention will be described with reference to FIG. 8. The device of this embodiment has three regions. A central region is a phase control region 124, and regions at both opposite ends are first and second active regions 125a and 125b. The phase control region 124 lacks an active layer and a diffraction grating.

When current is injected into the phase control region 124, the relationship between threshold currents $I_{1th}$ and $I_{2th}$ can further be adjusted. Therefore, the TE-mode and TM-mode oscillation zones can be separated from each other more readily.

A fabrication method for such a device will be described. A diffraction grating 121 is formed on an n-type InP substrate 130 only in the first and second active regions 125a and 125b. The diffraction grating 121 has a $\lambda/4$ phase shift section 121a at a location which is a distance Ls away from the end facet of the device. The distance Ls appropriately lies within $0.2 \leq Ls/(L_1+L_2) \leq 0.45$ or $0.55 \leq Ls/(L_1+L_2) \leq 0.8$, where $(L_1+L_2)$ is the sum of lengths of the first and second active regions 125a and 125b. In this embodiment, $Ls/(L_1+L_2)$ is set to 0.4. On the grating 121, an n-type InGaAsP guide layer 131, a $\phi$-InGaAsP active layer 132, a p-type InGaAsP buffer layer 113, a p-type InP clad layer 114 and a p-type InGaAsP contact layer 117 are consecutively laid down in this order. Then, etching is conducted down to the active layer 132 solely in the phase control region 124, and a p-type InP layer 114 is provided thereon. Thereafter, etching is conducted down to the substrate 130 with a mesa stripe of a width 2 μm being left, and then the substrate 30 is buried with an n-type InP layer and a p-type InP layer, similar to the first embodiment. The respective first and second active regions 125a and 125b and the phase control region 124 are electrically separated from each other so that current injected into those regions can be independently controlled. Further, p-type electrodes 119a, 119b and 119c are formed, and an n-type common electrode 120 is formed on the bottom surface of the device. Each of the first and second active regions 125a and 125b has a length of 300 μm, and the phase control region 124 has a length of 100 μm. Antireflection (AR) coatings (not shown) are deposited on the end facets of the device to establish a reflectance less than 0.1% thereat.

The device operates in the following manner. In the DFB-LD of this embodiment, effective refractive indices n for the TE polarization mode and the TM polarization mode differ from each other, so the α parameters for those polarization modes near threshold current density differ from each other, similarly to the first embodiment.

Figure 9:
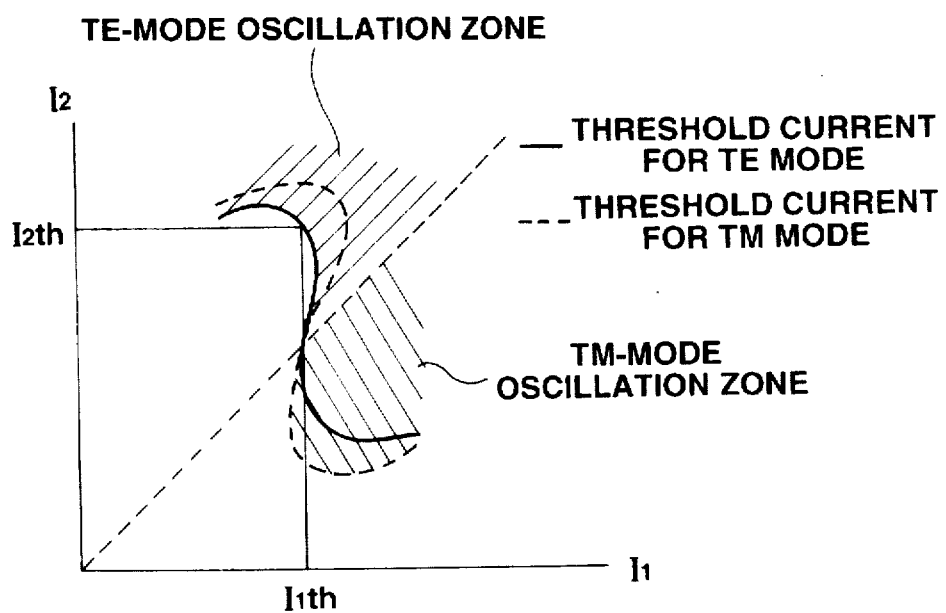
FIG. 9 is a graph illustrating the relationship between threshold currents injected through two electrodes of the second embodiment.

FIG. 9 illustrates the relationship between threshold currents injected into the first and second active regions 125a and 125b of the DFB-LD of this embodiment observed when the injection currents injected into the first and second active regions 125a and 125b are controlled and the injection current injected into the phase control region 124 is also adjusted. When the relationship between threshold currents injected into the first and second active regions 125a and 125b for the TE mode is examined, it can be seen from FIG. 9 that the relation is asymmetrical with respect to the line $I_1=I_2$ because the $\lambda/4$ phase shift portion 121a is formed only in one of the two active regions 125a and 125b, similarly to the first embodiment. Further, the relationship between threshold currents injected into the first and second active regions 125a and 125b is varied by controlling the injection current injected into the phase control region 124. FIG. 9 shows a case where the adjustment is performed so that asymmetry is increased, i.e., the asymmetry of the relation between the threshold curents with respect to the line $I_1=I_2$ is greater than that of the first embodiment.

Figure 10:
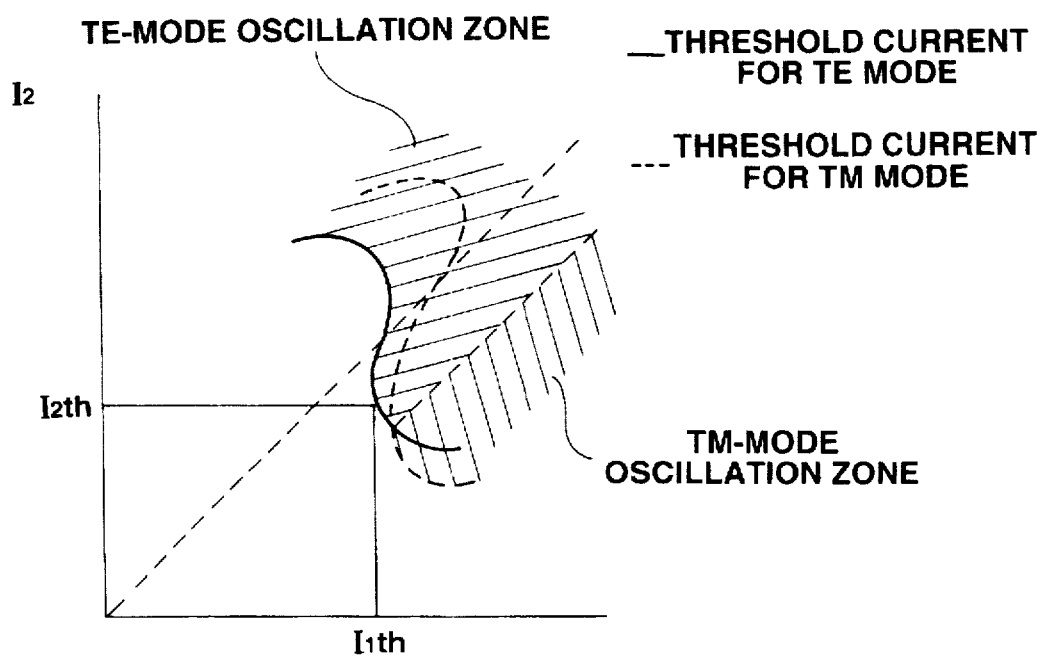
FIG. 10 is a graph illustrating the relationship between threshold currents injected through two electrodes of the second embodiment observed when gains for the TE mode and the TM mode are different from each other.

Turning to the case of the TM polarization mode, since the value of the α parameter is different from that in the TE mode as mentioned above, the relationship between the threshold currents injected through the two electrodes 119a and 119b is different from that in the TE polarization mode (see solid and dotted curves in FIG. 9). As a result, lowering the threshold current for one or the other of those modes tends to cause oscillation. The curves for TE-mode and TM-mode threshold currents intersect each other, resulting in the oscillation zones for the TE mode and the TM mode shown in FIG. 9. Therefore, it is possible to switch the oscillation mode between the TE mode and the TM mode by adjusting the injection current. The phase control region 124 is provided, and the current injected thereinto is controlled, to increase the asymmetry further. Therefore, even though gains and coupling coefficients for the TE mode and the TM mode slightly deviate from normal values, TE-mode and TM-mode oscillation zones can be obtained reliably as shown in FIG. 10. Thus, yield of the second embodiment is greater than that of the first embodiment.

Figure 11:
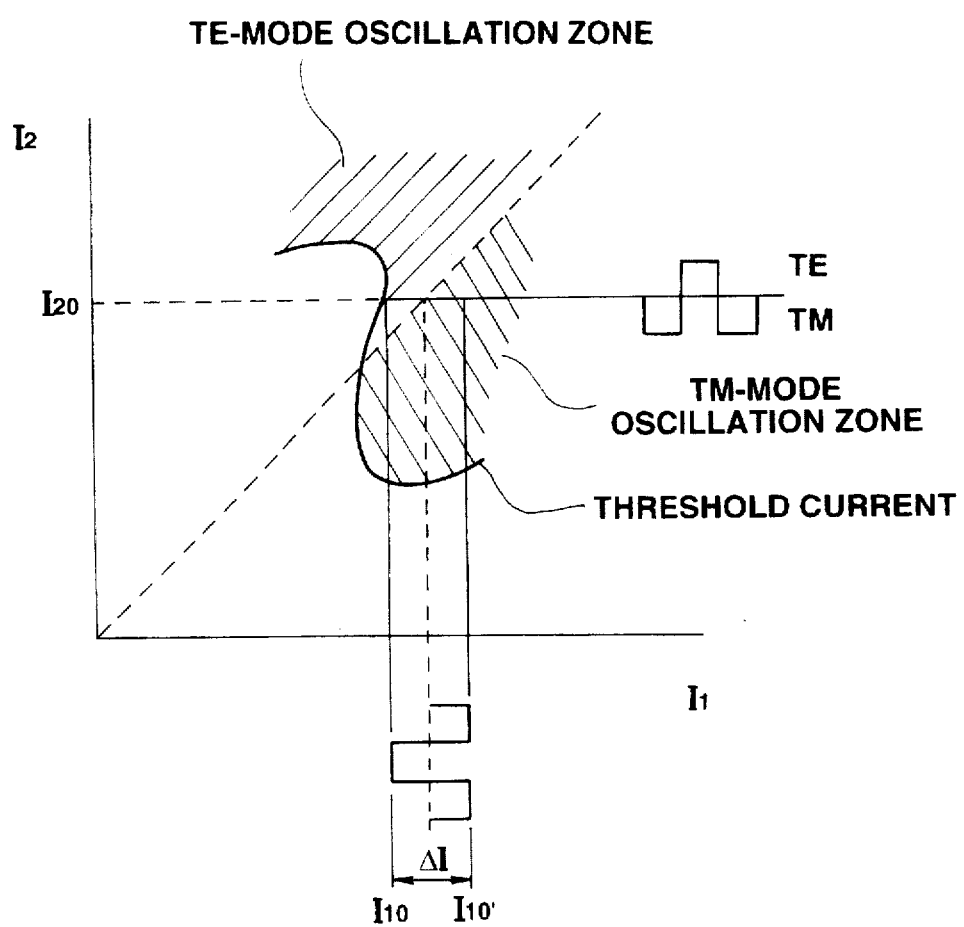
FIG. 11 is a graph illustrating a modulation method for driving the second embodiment.

FIG. 11 illustrates a modulation method for driving the laser of this embodiment. The current injected into the phase control region 124 is adjusted so that threshold currents injected into the two active regions 125a and 125b become asymmetrical. A bias current $I_{20}$ is injected into the second active region 125b of the semiconductor laser, and a bias current $I_{10}$ is injected into the first active region 125a on which a modulation current $\Delta I=I_{10}'-I_{10}$ is superposed. Thereby, output light from the device is modulated to switch between the TE polarization mode and the TM polarization mode. The output light is input into a polarizer, and only light in either the TE mode or the TM mode is transmitted therethrough. Thus, the light power can be generated as a zero-one signal. Similarly to the first embodiment, a favorable optical communication system can be built using the above modulation method.

Also, in this embodiment, modulation with a large extinction ratio can be obtained with a minute modulation current. Therefore, fluctuation in carrier density in the laser is small, so chirping is reduced and the line width of spectrum is decreased. Hence, high-speed modulation can be achieved with favorable characteristics. Further, the formation of the phase control region 124 provides stabler TE/TM modulation with a higher yield than that of the first embodiment.

Third Embodiment

Figure 12A:
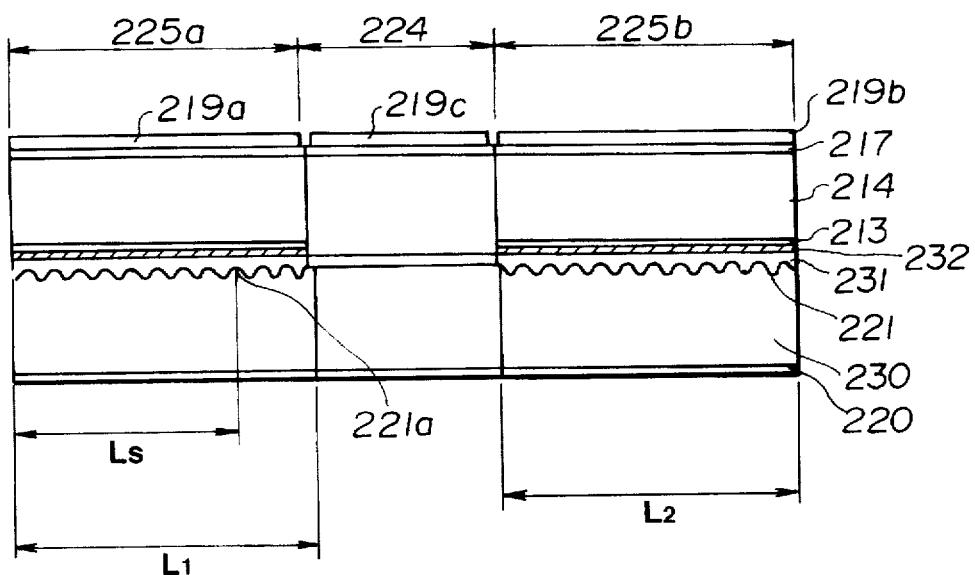
FIGS. 12A and 12B are cross-sectional views of a third embodiment of a semiconductor laser according to the present invention.
Figure 12B:
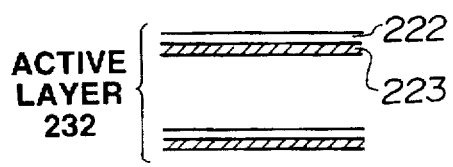

A third embodiment of the present invention will be described with reference to FIGS. 12A and 12B. A device of this embodiment has three regions, similar to the second embodiment. A central region is a phase control region 224, and regions at both opposite ends are first and second active regions 225a and 225b. The phase control region 224 lacks an active layer and a diffraction grating. In this embodiment, a strained quantum well structure is introduced into an active layer 232, so that TE-mode and TM-mode oscillation zones can be stably established. Thus, high performance of the device is achieved.

A fabrication method of a device will be described with reference to FIGS. 12A and 12B. A diffraction grating 221 is formed on an n-type InP substrate 230 solely in the first and second active regions 225a and 225b. The diffraction grating 221 has a λ/4 phase shift section 221a at a position which is a distance Ls away from the end surface of the device. The distance Ls appropriately lies within $0.2 \leq Ls/(L_1+L_2) \leq 0.45$ or $0.55 \leq Ls/(L_1+L_2) \leq 0.8$ where $(L_1+L_2)$ is the sum of lengths of the first and second active regions 225a and 225b, similar to the second embodiment. In this embodiment, $Ls/(L_1+L_2)$ is set to 0.4. On the grating 221, an n-type InGaAsP guide layer 231, a strained quantum well active layer 232, a p-type InGaAsP buffer layer 213, a p-type InP clad layer 214 and a p-type InGaAsP contact layer 217 are consecutively grown in this order. The active layer 232 consists of ten pairs of well layers 222 and barrier layers 223, as shown in FIG. 12B. The well layer 222 is an intrinsic $In_{0.53}Ga_{0.47}As$ having a thickness of 5 nm, and the barrier layer 223 is an intrinsic $In_{0.28}Ga_{0.72}As$ having a thickness of 5 nm.

Then, etching is conducted down to the active layer 232 only in the phase control region 224, and a p-type InP layer 214 and a contact layer 217 are layered thereon. Thereafter, etching is conducted down to the substrate 230 with a mesa stripe of a width 2 μm being left, and its surroundings are buried with an n-type InP layer and a p-type InP layer. The respective first and second active regions 225a and 225b and the phase control region 224 are electrically separated from each other so that currents injected into those regions can be independently controlled. Further, p-type electrode 219a, 219b and 219c are formed, and an n-type common electrode 220 is formed on the bottom surface of the device. Each of the first and second active regions 225a and 225b has a length of 300 μm, and the phase control region 224 has a length of 100 μm. Antireflection (AR) coatings (not shown) are deposited on the end facets of the device to establish a reflectance less than 0.1% thereat.

The device operates in the following manner. In the DFB-LD of this embodiment, effective refractive indices n for the TE polarization mode and the TM polarization mode differ from each other, so the α parameters for those modes near threshold current density differ from each other, similarly to the first embodiment. In this embodiment, the active layer 232 includes a multiple quantum well structure, and tensile strain is introduced into the barrier layer 223.

Therefore, the gain in the TM polarization mode can be made close to the gain in the TE polarization mode, and yield as a TE/TM switching laser is greatly improved. Further, compared with the case of a bulk active layer, a large gain coefficient can be obtained by a low current density and a preferred value of the a parameter can be obtained.

It can be seen that the relation is asymmetrical with respect to the line $I_1=I_2$ because the λ/4 phase shift section 221a is formed only in one of the two active regions 225a and 225b, similarly to the first embodiment. The asymmetry of the relation between the threshold curents with respect to the line $I_1=I_2$ is further increased over that of the first embodiment by controlling the current injected into the phase control region 224. Further, since the value of the α parameter for the TM mode is different from that for the TE mode, the curves for the TE-mode and TM-mode threshold currents intersect each other, similarly to the first embodiment, so that oscillation zones for the TE mode and the TM mode appear. Therefore, it is possible to switch the oscillation mode between the TE mode and the TM mode by adjusting the injection current.

A modulation method for switching the oscillation mode of the laser of this embodiment will be described. Similarly to the first embodiment, a bias current $I_{20}$ is injected into the second active region 225b of the semiconductor laser, and a bias current $I_{10}$ is injected into the first active region 225a on which a modulation current $\Delta I = I_{10}' - I_{10}$ is superposed. Thus, output light from the laser is modulated to switch between the TE polarization mode and the TM polarization mode. The output light is input into a polarizer and only light in either the TE mode or the TM mode is transmitted therethrough. Thus, light power can be generated as a zero-one signal. Similarly to the first embodiment, a favorable optical communication system can be built using the above modulation method.

Also in this embodiment, polarization mode modulation with a large extinction ratio can be obtained with a minute modulation current. Therefore, fluctuation in carrier density in the laser is small, so chirping is reduced and the line width of oscillation spectrum is decreased. Hence, high-speed modulation can be achieved with favorable characteristics. Further, the gain for the TE mode is made approximately equal to the gain for the TM mode, and hence a large gain coefficient can be obtained with a low curent density. As a result, the threshold current is lowered, the efficiency is improved and yield as a TE/TM switching device is improved.

Fourth Embodiment

A fourth embodiment of the present invention will be described with reference to FIG. 8. A wavelength tunable laser used in this embodiment is a laser which has the same characteristics as the laser used in the second embodiment. The oscillation wavelength of the laser used in the second embodiment can be changed by varying current injected into the active regions 125a and 125b as shown in FIG. 8.

A modulation method for switching the laser of the second embodiment as used in the fourth embodiment will be described. Similarly to the second embodiment, current injected into the phase control region 124 is adjusted so that threshold currents injected into the two active regions 125a and 125b becomes asymmetric. A bias current $I_{21}$ is injected into the second active region 125b of the semiconductor laser, and a bias current $I_{11}$ is injected into the first active region 125a on which a modulation current $\Delta I = I_{11}' - I_{11}$ is superposed, as a signal ①. In this way, output light is modulated to switch between wavelengths $\lambda_1$ (the TE mode)

and a wavelength $\lambda_1'$ (the TM mode). Similarly, a bias current $I_{22}$ is injected into the second active region 125b of the semiconductor laser, and a bias current $I_{12}$ is injected into the first active region 125a on which a modulation current $\Delta I = I_{12}' - I_{12}$ is superposed, as a signal ②. In this way, output light is modulated to switch between wavelengths $\lambda_2$ (the TE polarization mode) and $\lambda_2'$ (the TM polarization mode). Thus, polarization mode and wavelength of the output light can be changed by varying the modulation current. The output light is input into a polarizer and only light in the TE mode at a wavelength $\lambda_n$ is transmitted therethrough (the TM-mode light is removed). Thus, for all of the wavelengths $\lambda_1, \lambda_2, \ldots, \lambda_n$, light power can be generated as a zero-one signal.

Figure 13A:
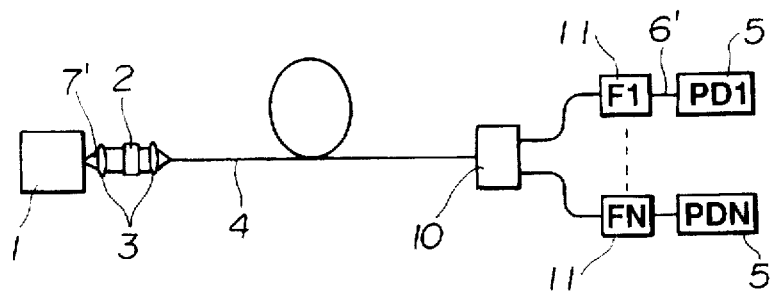
FIGS. 13A, 13B, 13C and 13D are views illustrating an optical communication system in which the second embodiment and its modulation method are used.
Figure 13B:
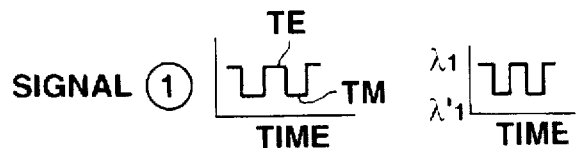
Figure 13B:
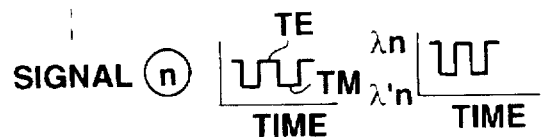
Figure 13C:
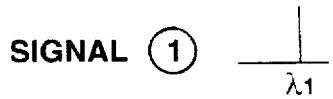
Figure 13C:
Figure 13D:
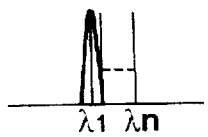

FIG. 13A shows the structure of a wavelength division multiplexing optical communication system using the modulation method of the second embodiment. A semiconductor laser 1 is modulated by a modulation current $I_{1n}' - I_{1n}$ according to the above method. The output light becomes a signal 7' (signal ⓝ) which is modulated between wavelengths $\lambda_n$ (the TE polarization mode) and $\lambda_n'$ (the TM polarization mode). The light 7' is input into a polarizer 2 through a lens 3, and only $\lambda_n$ (the TE polarization mode) is transmitted therethrough to create a signal 6' having a power level 1 or 0 as illustrated in FIG. 13C. The light transmitted through the polarizer 2 is coupled to an optical fiber 4 using lens 3. After transmission through the optical fiber 4, the light is divided into n components by a branching device 10. Only component of the divided light at a wavelength $\lambda_n$ is transmitted through a receiving filter 11 (Fn) having characteristic as illustrated in FIG. 13D, and a signal with a power level 1 or 0.

A receiving filter 11 separates wavelengths which are only about 1 Å away from each other, so a wavelength filter having a small transmission band width is needed. For example, a DFB filter, a Fabry-Perot filter, a Max-Zehnder filter or the like can be used. Light transmitted through the receiving filter 11 is received by a photodetector 5 to detect each signal.

Further, the wavelength filter may be replaced by a tunable filter which has a tunable function, so that the channel can be freely selected on the receiver side.

Also in this embodiment, signal modulation with a large extinction ratio can be obtained with a minute modulation current. Therefore, fluctuation in carrier density in the laser is small, so chirping is reduced and the line width of oscillation spectrum is decreased. Hence, high-speed modulation can be performed with favorable characteristics. Further, the spectral width is small, so the number of multiplexed wavelengths can be large when different wavelengths are assigned to different signals or channels. Moreover, signals with a good extinction ratio can be obtained. As a result, it is possible to achieve more easily communications that have a high extinction ratio, high speed and a large wavelength multiplicity.

According to the present invention, TE-mode and TM-mode oscillation zones can be assuredly procured, and both yield and controllability of a semiconductor laser can be improved.

Furthermore, gains of an active region for the TE mode and the TM mode can be made close to each other, so TE-mode and TM-mode oscillation zones can be assuredly procured and both yield and controllability can be improved.

Moreover, fluctuation in carrier density in a semiconductor laser can be small even at the time of high-speed modulation, so the chirping is reduced, and at the same time, an extinction ratio is increased.

Except as otherwise disclosed herein, the various components shown in outline or block form in the Figures are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the appended claims.

what is claimed is:

1. A semiconductor laser comprising:
   a distributed feedback semiconductor laser structure having a plurality of regions, each of at least two regions of said plurality of regions comprising an active region having an active layer;
   at least two electrode means each of which is disposed on said at least two regions for injecting current into said active region, said at least two electrode means being electrically separated from each other;
   a controlling means for controlling said current which is injected into said active region, wherein said controlling means controls said current so that a polarization mode of output light from said at least two active regions is modulated between transverse electric (TE) and transverse magnetic (TM) polarization modes; and
   a phase shift section provided in a grating in one of said at least two regions, said phase shift section being offset from a center of said two active regions, with no phase shift section provided in the other of said at least two regions,
   said regions and said phase shift section being arranged such that α parameters for transverse electric (TE) and transverse magnetic (TM) polarization modes, in the vicinity of threshold currents for the TE mode, and the TM mode, are made different from each other, each of said plurality of α parameters being defined by $4\pi/\lambda \cdot (dn/dN)/(dg/dN)$, where $\lambda$ is a Bragg wavelength, n is an effective refractive index, N is an injection carrier density and g is a gain, $\lambda$, n, N and g being defined for each of the TE mode and the TM mode, and dn/dN and dg/dN are respectively the first derivatives of n and g with respect to N.

2. A semiconductor laser according to claim 1, wherein a phase shift amount of said phase shift section is $\lambda/4$.

3. A semiconductor laser according to claim 1, wherein at least one of said regions comprises a phase control region without an active layer for controlling only a phase of a propagating wave.

4. A semiconductor laser according to claim 1, wherein said active layer comprises a bulk active layer.

5. A semiconductor laser according to claim 1, wherein said active layer comprises a strained quantum well structure into which a biaxial tensile strain is introduced.

6. A semiconductor laser according to claim 1, wherein a distance Ls of said phase shift section from an end facet of said semiconductor laser is within $0.2 \leq Ls/L \leq 0.45$ or $0.55 \leq Ls/L \leq 0.8$, where L is a total length of said two active regions.

7. A semiconductor laser according to claim 1,
   wherein gains of said active region for the TE mode and the TM mode are similar to each other.

8. An optical communication method for transmitting a signal from a transmitter to a receiver through an optical transmission line, said method comprising the steps of:

modulating the polarization mode of output light from a semiconductor laser between transverse electric (TE) and transverse magnetic (TM) polarization modes by controlling a current injected into the semiconductor laser, said semiconductor laser comprising:

a distributed feedback semiconductor laser structure having a plurality of regions, each of at least two regions of said plurality of regions comprising an active region having an active layer;

at least two electrode means each of which is disposed on said at least two regions for injecting current into said active region, said at least two electrode means being electrically separated from each other, a controlling means for controlling said current which is injected into said active region, wherein said controlling means controls said current so that a polarization mode of output light from said at least two active regions is modulated between transverse electric (TE) and transverse magnetic (TM) polarization modes, and a phase shift section provided in a grating in one of said at least two regions, said phase shift section being offset from a center of said active regions, with no phase shift section provided in the other of said at least two regions, said regions and said phase shift section being arranged such that α parameters for transverse electric (TE) and transverse magnetic (TM) polarization modes, in the vicinity of threshold currents for the TE mode and the TM mode, are made different from each other, each of said plurality of α parameters being defined by $4\pi/\lambda \cdot (dn/dN)/(dg/dN)$, where $\lambda$ is a Bragg wavelength, n is an effective refractive index, N is an injection carrier density and g is a gain, $\lambda$, n, N and g being defined for each if the TE mode and the TM mode, and dn/dN and dg/dN are respectively the first derivatives of n and g with respect to N;

selecting only the output light in either the TE mode or the TM mode to create an amplitude-modulated signal; and transmitting the amplitude-modulated signal through an optical transmission line.

9. An optical communication method according to claim 8, wherein the wavelength of the amplitude-modulated signal is tunable by the semiconductor laser, and a signal at a desired wavelength is selectively detected by using a wavelength filter at a receiver side.

10. An optical communication method according to claim 9, wherein a plurality of wavelength filters are used to selectively detect a plurality of signals at respective desired wavelengths to perform a wavelength division multiplexing optical communication.

11. An optical communication system for transmitting a signal from a transmitter to a receiver through an optical transmission line, said system comprising:

a semiconductor laser provided in a transmitter, a polarization mode of output light from said semiconductor laser being modulated between transverse electric (TE) and transverse magnetic (TM) polarization modes by controlling a current injected into said semiconductor laser, and said semiconductor laser comprising:

a distributed feedback semiconductor laser structure having a plurality of regions, each of at least two regions of said plurality of regions comprising an active region having and active layer, at least two electrode means each of which is disposed on said at least two regions for injecting current into said active region, said at least two electrode means being electrically separated from each other, a controlling means for controlling said current which is injected into said active region, wherein said controlling means controls said current so that a polarization mode of output light from said at least two active regions is modulated between transverse electric (TE) and transverse magnetic (TM) polarization modes, and a phase shift section provided in a grating in one of said at least two regions, said phase shift section being offset from a center of said two active regions, with no phase shift section provided in the other of said at least two regions, said regions and said phase shift section being arranged such that α parameters for transverse electric (TE) and transverse magnetic (TM) polarization modes, in the vicinity of threshold currents for the TE mode and the TM mode, are made different from each other, each of said plurality of α parameters being defined by $4\pi/\lambda \cdot (dn/dN)/(dg/dN)$, where $\lambda$ is a Bragg wavelength, n is an effective refractive index, N is an injection carrier density and g is a gain, $\lambda$, n, N and g being defined for each of the TE mode and the TM mode, and dn/dN and dg/dN are respectively the first derivatives of n and g with respect to N; and means for selecting only the output light in either the TE mode or the TM mode to create an amplitude-modulated signal, the amplitude-modulated signal being transmitted from the transmitter to a receiver through an optical transmission line.

12. An optical communication system according to claim 11, wherein said semiconductor laser is capable of changing the wavelength of the amplitude-modulated signal, and further comprising a wavelength filter provided in the receiver for selectively detecting a signal at a desired wavelength.

13. An optical communication system according to claim 12, wherein a plurality of wavelength filters are used to selectively detect a plurality of signals at respective desired wavelengths to perform a wavelength division multiplexing optical communication.

14. A semiconductor laser comprising:

a distributed feedback semiconductor laser stricture having a plurality of regions, each of at least two regions of said plurality of regions comprising an active region having an active layer; and electrodes for injecting current into said active regions of said at least two regions, said current being independently injected into said active regions of said at least two regions, wherein one of said at least two regions has a phase shift section in which a phase of a grating shifts, and a second of said at least two regions does not have a phase shift section, and wherein a polarization mode of output light from said at least two regions is selected by controlling the current injected into said at least two regions.

15. According to claim 14, wherein said regions and said phase shift section are arranged such that α parameters for transverse electric (TE) and transverse magnetic (TM) polarization modes, in the vicinity of threshold currents for the TE mode, and the TM mode, are made different from each other, each of said plurality of α parameters being defined by $4\pi/\lambda \cdot (dn/dN)/(dg/dN)$, where $\lambda$ is a Bragg wavelength, n is an effective refractive index, N is an injection carrier density and g is a gain, $\lambda$, n, N and g being defined for each of the TE mode and the TM mode, and dn/dN and dg/dN are respectively the first derivatives of n and g with respect to N.

16. A semiconductor laser according to claim 14, wherein said active layer comprises a bulk active layer.

17. A semiconductor laser according to claim 14, wherein said active layer comprises a strained quantum well structure into which a biaxial tensile strain is introduced.

18. An operating method for a semiconductor laser, which semiconductor laser comprises a distributed feedback semiconductor laser structure having a plurality of regions, each of at least two regions of the plurality of regions comprising an active region having an active layer, one of the at least two regions having a phase shift section in which a phase of a grating shifts, and a second of the at least two regions not having a phase shift section, said method comprising the steps of:

injecting current independently into said active regions of said at least two active regions; and controlling the current injected into the active regions of the at least two regions, to select a polarization mode of the output light from the at least two regions.

19. A method according to claim 18, wherein control of said polarization mode of output light is performed by controlling the current being injected into one of the at least two regions.

20. A method according to claim 19, wherein control of the polarization mode of output light is performed by controlling the current being injected into the one region which has the phase shift section.

* * * * *

UNITED STATES PATENT AND TRADEMARK OFFICE
CERTIFICATE OF CORRECTION

PATENT NO. : 5,757,840

DATED : May 26, 1998

INVENTOR(S): TAMAYO HIROKI

It is certified that error appears in the above-identified patent and that said Letters Patent is hereby corrected as shown below:

<u>ON COVER PAGE AT [54] IN THE TITLE OF THE INVENTION</u>

"LASER" should read --LASER,--.

<u>COLUMN 1</u>

In the title, "LASER" SHOULD READ --LASER,--.

<u>COLUMN 3</u>

Line 17, "embodiment. FIGS." should read
--embodiment. ¶ FIGS.--

<u>COLUMN 4</u>

Line 17, "plarization" should read --polarization--;
Line 59, "is the" should read --in the--.

<u>COLUMN 5</u>

Line 25, "with large" should read --with a large--;
Line 40, "$I_{2th}$," should read --$I_{2th}$--.

<u>COLUMN 6</u>

Line 32, "curents" should read --currents--.

UNITED STATES PATENT AND TRADEMARK OFFICE
CERTIFICATE OF CORRECTION

PATENT NO. : 5,757,840

DATED       : May 26, 1998

INVENTOR(S): TAMAYO HIROKI

It is certified that error appears in the above-identified patent and that said Letters Patent is hereby corrected as shown below:

<u>COLUMN 8</u>

Line 6, "the a" should read --the $\alpha$--;
Line 12, "curents" should read --currents--;
Line 45, "current" should read --currents--;
Line 62, "becomes" should read --become--.

<u>COLUMN 9</u>

Line 31, "acteristic" should read --acteristics--.

<u>COLUMN 11</u>

Line 67, "and" should read --an--.

Signed and Sealed this

Twelfth Day of January, 1999

Attest:

Attesting Officer

*Acting Commissioner of Patents and Trademarks*